United States Patent
Hasegawa et al.

(10) Patent No.: US 9,735,710 B2
(45) Date of Patent: Aug. 15, 2017

(54) POWER GENERATOR HAVING A MULTIPLE-DEGREE-OF-FREEDOM VIBRATION SYSTEM AND A POWER GENERATING ELEMENT ATTACHED TO THE VIBRATION SYSTEM WHILE CONVERTING VIBRATION ENERGY OF A VIBRATING MEMBER TO ELECTRICAL ENERGY

(71) Applicants: SUMITOMO RIKO COMPANY LIMITED, Komaki-shi, Aichi (JP); Panasonic Corporation, Kadoma-shi, Osaka (JP)

(72) Inventors: Koichi Hasegawa, Kasugai (JP); Hajime Kurikuma, Komaki (JP); Atsushi Muramatsu, Komaki (JP); Hidenori Katsumura, Hyogo (JP); Akihiko Namba, Osaka (JP); Hiroshi Kagata, Osaka (JP)

(73) Assignees: SUMITOMO RIKO COMPANY LIMITED, Komaki (JP); PANASONIC CORPORATION, Osaka (JP)

( * ) Notice: Subject to any disclaimer, the term of this patent is extended or adjusted under 35 U.S.C. 154(b) by 142 days.

(21) Appl. No.: 14/747,617

(22) Filed: Jun. 23, 2015

(65) Prior Publication Data
US 2015/0295520 A1    Oct. 15, 2015

Related U.S. Application Data

(63) Continuation of application No. PCT/JP2013/083511, filed on Dec. 13, 2013.

(30) Foreign Application Priority Data

Mar. 13, 2013 (JP) ................................. 2013-049962

(51) Int. Cl.
 *H02N 2/18* (2006.01)
 *H01L 41/113* (2006.01)

(52) U.S. Cl.
 CPC ......... *H02N 2/188* (2013.01); *H01L 41/1136* (2013.01)

(58) Field of Classification Search
 CPC ............................... H02N 2/18; H01L 41/113
 (Continued)

(56) References Cited

U.S. PATENT DOCUMENTS 7,948,153 B1 *  5/2011  Kellogg .............. H01L 41/1136
                                                           310/329
9,525,365 B2 * 12/2016  Katsumura ......... H01L 41/1136
 (Continued)

FOREIGN PATENT DOCUMENTS

CN      103162872 A      6/2013
JP    2010-246365 A     10/2010
 (Continued)

OTHER PUBLICATIONS

Oct. 23, 2014 Office Action issued in Japanese Patent Application No. 2014-530835.
 (Continued)

*Primary Examiner* — J.San Martin
(74) *Attorney, Agent, or Firm* — Oliff PLC

(57) ABSTRACT

A power generator including: a vibration system configured to be attached to a vibrating member; and a power generating element attached to the vibration system. The vibration system is a multiple-degree-of-freedom vibration system that includes a first vibration system having a first mass member elastically supported by a first spring member, and a second vibration system having a second mass member elastically connected to the first mass member by a second spring member. The power generating element is arranged
 (Continued)

between the first and second mass members, and vibration applied from the vibrating member causes relative displacement of the first and second mass members so that vibration energy of the vibrating member is input to the power generating element. A natural frequency of the first vibration system is different from that of the second vibration system.

7 Claims, 5 Drawing Sheets

(58) Field of Classification Search
USPC .......................................................... 310/339
See application file for complete search history.

(56) References Cited

U.S. PATENT DOCUMENTS

| | | | | |
|---|---|---|---|---|
| 2009/0174289 A1* | 7/2009 | Tanner | ................ | H01L 41/053 310/339 |
| 2012/0001518 A1* | 1/2012 | Moler | .................... | H02N 2/043 310/319 |
| 2013/0154442 A1 | 6/2013 | Koyama et al. | | |
| 2013/0320807 A1* | 12/2013 | Sakaguchi | ............. | H02N 2/188 310/339 |
| 2014/0295365 A1* | 10/2014 | Casset | ....................... | F03G 7/06 432/1 |
| 2014/0327339 A1* | 11/2014 | Katsumura | ......... | H01L 41/1134 310/321 |
| 2015/0135869 A1* | 5/2015 | Jia | .......................... | H02N 2/188 74/96 |
| 2015/0145375 A1* | 5/2015 | Sakaguchi | .......... | H01L 41/1136 310/321 |
| 2015/0145376 A1* | 5/2015 | Sun | .................... | H01L 41/1134 310/339 |
| 2015/0188030 A1* | 7/2015 | Andosca | ............. | H01L 41/1136 310/319 |
| 2015/0188458 A1* | 7/2015 | Andosca | ................... | F03G 7/08 310/319 |
| 2015/0221855 A1* | 8/2015 | Vaeth | .................. | H01L 41/1136 310/319 |
| 2015/0295520 A1* | 10/2015 | Hasegawa | .............. | H02N 2/188 310/323.01 |
| 2016/0043663 A1* | 2/2016 | Katsumura | ............ | H02N 2/188 310/339 |
| 2016/0164390 A1* | 6/2016 | Furukawa | .............. | H02K 35/02 310/339 |
| 2016/0197261 A1* | 7/2016 | Abdelkefi | ........... | H01L 41/1136 310/312 |

FOREIGN PATENT DOCUMENTS

| | | |
|---|---|---|
| JP | 2011-152004 A | 8/2011 |
| JP | 2011-160548 A | 8/2011 |
| JP | 2012-005192 A | 1/2012 |
| JP | 4862286 B2 | 1/2012 |
| JP | 2012-079667 A | 4/2012 |
| JP | 2013-010416 A | 1/2013 |
| WO | 2012/137695 A1 | 10/2012 |
| WO | 2013/024848 A1 | 2/2013 |

OTHER PUBLICATIONS

Mar. 25, 2014 International Search Report issued in International Patent Application No. PCT/JP2013/083511.
Sep. 15, 2015 International Preliminary Report on Patentability issued in International Application No. PCT/JP2013/083511.
Oct. 9, 2016 Office Action issued in Chinese Patent Application No. 201380073661.0.

* cited by examiner

POWER GENERATOR HAVING A MULTIPLE-DEGREE-OF-FREEDOM VIBRATION SYSTEM AND A POWER GENERATING ELEMENT ATTACHED TO THE VIBRATION SYSTEM WHILE CONVERTING VIBRATION ENERGY OF A VIBRATING MEMBER TO ELECTRICAL ENERGY

INCORPORATED BY REFERENCE

The disclosure of Japanese Patent Application No. 2013-049962 filed on Mar. 13, 2013, including the specification, drawings and abstract is incorporated herein by reference in its entirety. This is a Continuation of International Application No. PCT/JP2013/083511 filed on Dec. 13, 2013.

BACKGROUND OF THE INVENTION

1. Field of the Invention

The present invention relates to a power generator that converts vibration energy of a vibrating member to electrical energy using a power generating element.

2. Description of the Related Art

From the past, with vibrating members (vehicle or washing machine body or the like) that support a vibration source such as an automobile power unit, a washing machine motor or the like, there have been ways devised to reduce the vibration such as by attaching a dynamic damper or the like.

However, to handle the high demand for energy saving in recent times, with Japanese Unexamined Patent Publication No. JP-A-2011-152004 and the like, power generators have been proposed that convert vibration energy to electrical energy. Specifically, with the power generator of JP-A-2011-152004, a piezoelectric vibrating body is constituted by attaching a piezoelectric element to a vibration system for which a mass member is elastically connected to a vibrating member by a spring member, and conversion of vibration energy to electrical energy is performed with the piezoelectric element by deformation of the spring member.

However, with the power generator described in JP-A-2011-152004, the piezoelectric vibrating body is a one-degree-of-freedom vibration system for which the mass member is elastically supported by the spring member, so for vibration input of a frequency that is off from the natural frequency, there is the risk of not being able to generate sufficient deformation of the spring member, and not being able to effectively obtain power.

With JP-A-2011-152004, it was also proposed to realize power generation for vibration input of a broad frequency range by providing a plurality of piezoelectric vibrating bodies with different natural frequencies. However, even with a structure for which a plurality of piezoelectric vibrating bodies is provided in this way, there is a limit to the frequency range for which power can be generated for each of the piezoelectric vibrating bodies, so it was difficult to make it possible to generate electricity for vibration input with a broad frequency range.

SUMMARY OF THE INVENTION

The present invention has been developed in view of the above-described matters as the background, and it is an object of the present invention to provide a power generator with a novel structure which is able to realize high efficiency power generation for vibration input of a broad frequency range.

Specifically, a first mode of the present invention provides a power generator comprising: a vibration system configured to be attached to a vibrating member; and a power generating element attached to the vibration system while converting vibration energy of the vibrating member to electrical energy, wherein the vibration system is a multiple-degree-of-freedom vibration system that includes a first vibration system in which a first mass member is elastically supported by a first spring member, and a second vibration system in which a second mass member is elastically connected to the first mass member by a second spring member, the power generating element is arranged between the first mass member and the second mass member, and relative displacement of the first mass member and the second mass member is caused with vibration being applied from the vibrating member to the first mass member and transmitted to the second mass member so that the vibration energy of the vibrating member is input to the power generating element, and a natural frequency of the first vibration system is different from a natural frequency of the second vibration system.

With the power generator constituted according to this kind of first mode, with a plurality of mutually different natural frequencies, sufficient volume of the relative displacement of the first mass member and the second mass member is ensured to be large by the resonance phenomenon, and it is possible to efficiently obtain a power generation volume of the power generating element obtained according to the volume of the relative displacement of the first mass member and the second mass member.

In fact, by arranging the power generating element between the first and second mass members of the multiple-degree-of-freedom vibration system, during vibration input of a frequency range for which the first mass member and the second mass member are relatively displaced in the opposite phase, even with an input vibration of a frequency that is off from the natural frequency of the vibration system, it is possible to ensure a large volume of the relative displacement of the first mass member and the second mass member. Because of that, it is possible to obtain sufficient power generation volume of the power generating element in relation to vibration input of a broad frequency range, and possible to effectively obtain power.

Here, relative displacement means the vibration of the vibrating member being applied to the first mass member via the first spring member, the first mass member itself vibrating, that vibration then further being transmitted to the second mass member via the second spring member, and the second mass member being displaced in relation to the first mass member.

In this way, with the power generator of this mode, not only with vibration input of a frequency that matches the mechanical natural frequency of the vibration system, but also with vibration input for a frequency range that is off from the natural frequency, effective power generation is realized, and it is possible to efficiently convert vibration energy to electrical energy.

A second mode of the present invention provides the power generator according to the first mode, wherein the natural frequency of the second vibration system is set to a lower frequency in relation to the natural frequency of the first vibration system.

With the power generator of the second mode, the natural frequency of the second vibration system is set to a low frequency in relation to the natural frequency of the first vibration system, so the spring constant of the second spring member is set to be small, it is easier to ensure sufficient volume of the relative displacement of the second mass member in relation to the first mass member, and it is easy to further improve the power generating efficiency corresponding to the volume of the relative displacement of the first mass member and the second mass member. With a lower frequency range than the antiresonance frequency with the two-degree-of-freedom vibration system, displacement is done in the same phase to the input vibration for both the first mass member and the second mass member, so the energy of the input vibration is efficiently applied to the first and second vibration system, and it is possible to realize effective power generation.

A third mode of the present invention provides the power generator according to the first or second mode, wherein the natural frequency of the first vibration system is set to a higher frequency than an electrical antiresonance frequency of the second vibration system.

With the third mode, with a higher frequency range than the electrical antiresonance frequency for which a drop in power generating efficiency easily becomes a problem with a one-degree-of-freedom vibration system power generator, there is an improvement in power generating efficiency based on the resonance or the like at the secondary natural frequency of the vibration system, and it is possible to realize effective power generation on the vibration input of broader frequency ranges.

A fourth mode of the present invention provides the power generator according to any one of the first through third modes, wherein the natural frequency of the first vibration system is $\sqrt{2}$ times or less in relation to the natural frequency of the second vibration system.

With the fourth mode, by the vibration of the first vibration system and the vibration of the second vibration system being mutually transmitted and being in a combined vibration state, it is possible to mutually complement and maintain a vibrating state of the first vibration system and the second vibration system across a broad frequency range, and possible to efficiently realize power generation.

A fifth mode of the present invention provides the power generator according to any one of the first through fourth modes, wherein a resonance response magnification of the second vibration system is made larger than a resonance response magnification of the first vibration system, and a product of a mass of the first mass member and the resonance response magnification of the first vibration system is larger than a product of a mass of the second mass member and the resonance response magnification of the second vibration system.

With the fifth mode, by the resonance response magnification of the second vibration system being made to be larger than the resonance response magnification of the first vibration system, a large amplitude of the second mass member is ensured during vibration input, and efficient power generation is realized with the power generating element arranged in the second vibration system. Also, the offset vibration damping action that acts between the first vibration system and the second vibration system is inhibited, and a vibrating state between the first vibration system and the second vibration system is stably ensured, so effective power generation is realized for wide band vibration.

A sixth mode of the present invention provides the power generator according to any one of the first through fifth modes, further comprising a stopper that restricts the relative displacement of the second mass member in relation to the first mass member.

With the sixth mode, excessive relative displacement of the first mass member and the second mass member is prevented by the stopper, the input to the power generating element is restricted, and damage or the like to the power generating element is prevented.

A seventh mode of the present invention provides the power generator according to any one of the first through sixth modes, wherein the first spring member is formed of a rubber elastic body.

With the seventh mode, the first spring member is formed using a rubber elastic body having damping performance, so sufficient volume of the relative displacement of the first mass member and the second mass member is ensured for input of a wider frequency range, and effective power generation is realized.

An eighth mode of the present invention provides the power generator according to any one of the first through seventh modes, wherein the first spring member is formed of a rubber elastic body and the second spring member is formed of a plate spring, one end side of the plate spring is attached to the first mass member and the second mass member is attached to another end side of the plate spring so that the vibration of the vibrating member is applied to the plate spring, and the power generating element is mounted on the plate spring.

With the eighth mode, it is possible to effectively broaden the frequency characteristics by the high damping capacity of the rubber elastic body constituting the first vibration system, and possible to obtain a large vibration magnification by the low damping capacity of the plate spring constituting the second vibration system. Because of that, with the plate spring that is the second spring member, a large elastic deformation is brought about in relation to the input vibration of a broader frequency range, and even more power generating efficiency is exhibited more stably with the power generating element mounted on the plate spring. As the power generating element mounted on the plate spring, a piezoelectric element, a magnetostrictive element or the like which can convert a mechanical physical amount of plate spring distortion, deformation, stress or the like to energy can be suitably used. Also, as the plate spring, a metal spring such as spring steel or the like can be suitably used, but it is also possible to use a resin spring or the like according to the conditions, and it is possible to do complementary addition of the desired damping capacity by coating the surface with rubber.

A ninth mode of the present invention provides the power generator according to any one of the first through eighth modes, wherein the first mass member has a hollow structure provided with a housing space inside, and the second vibration system is housed within the housing space.

With the ninth mode, the center of gravity position of the first mass member and the second mass member is set to be low and near, so the vibration other than in the target direction of the first and second member is suppressed to be low, and the vibration of the target direction is input stably, and there is an improvement in power generating efficiency by the first and second vibration system. Also, since the second vibration system is housed within the housing space separated from the external space, it is not necessary to provide a separate member for dust proofing, water proofing or the like for the second vibration system.

A tenth mode of the present invention provides the power generator according to any one of the first through ninth modes, wherein the power generator is configured to be mounted on a site of the vibrating member by which vibrations of multiple types whose vibration levels become maximum within mutually different frequency ranges are applied to the vibration system.

With the tenth mode, by applying the power generator of the constitution according to the present invention using a multiple-degree-of-freedom vibration system to a specific vibrating member having a vibration peak at a plurality of different frequency ranges, it is possible to obtain stable power generating efficiency under diverse situations. As the vibrating member used by this mode, examples include an electric washing machine for which the vibration frequency differs according to the laundry weight or the like, an automobile for which the vibration frequency differs according to the travel state or the like, for example.

Also, as another mode of the present invention, it is possible to use the power generator according to any one of the first through tenth modes wherein the mass of the first mass member is 10% or greater than the equivalent mass of the vibrating member.

With this mode, the first vibration system functions as a dynamic damper that offsets and reduces the vibration of the vibrating member, and it is possible to obtain effective vibration damping action.

With the present invention, the power generating element is arranged between the first mass member and the second mass member that constitute the multiple-degree-of-freedom vibration system, and power can be obtained with the power generating element according to the volume of the relative displacement of the first mass member and the second mass member. Because of that, it is possible to obtain power by the power generating element for vibration input of a plurality of mutually different frequencies, and efficient power generation is realized by the power generating element for vibration input of a broad frequency range for which the first mass member and the second mass member are displaced in the opposite phase.

BRIEF DESCRIPTION OF THE DRAWINGS

The foregoing and/or other objects, features and advantages of the invention will become more apparent from the following description of a preferred embodiment with reference to the accompanying drawings in which like reference numerals designate like elements and wherein.

DETAILED DESCRIPTION OF PREFERRED EMBODIMENTS

Figure 1:
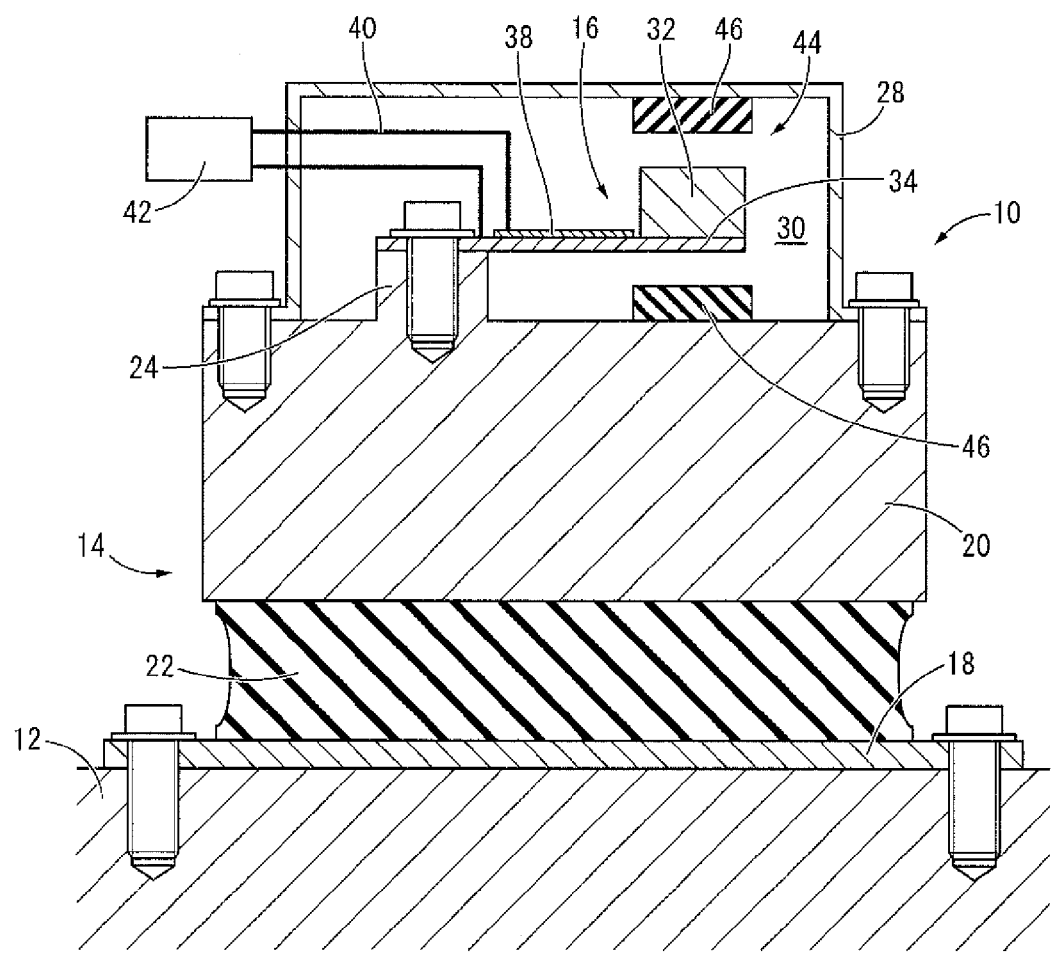
FIG. 1 is a vertical cross section view showing a power generator as a first embodiment of the present invention.

Following, we will describe embodiments of the present invention while referring to the drawings.

FIG. 1 shows a power generator 10 as a first embodiment of the present invention. As is also shown with the vibration model of FIG. 2, the power generator 10 is equipped with a multiple-degree-of-freedom vibration system including a first vibration system 14 attached to a body 12 as a vibrating member, and a second vibration system 16 attached to the body 12 via the first vibration system 14. With the description hereafter, unless there is a specific explanation, the vertical direction means the vertical direction in FIG. 1 which is the main vibration input direction of the body 12.

In more specific detail, the first vibration system 14 has a constitution for which an attachment member 18 and a first mass member 20 are elastically connected by a connecting rubber elastic body 22 as a first spring member, and by the attachment member 18 being fixed to the body 12 by a bolt or the like, the first mass member 20 is elastically connected to the body 12 by the connecting rubber elastic body 22. The shape and forming material of the first mass member 20 is not particularly restricted, but it is desirable to be formed from a material with a high specific gravity to make it more compact, and with this embodiment, this is a member exhibiting a solid rectangular block shape formed from iron. Furthermore, a support projection 24 projecting upward is integrally formed on the first mass member 20, and a screw hole is formed so as to open on that top surface. The connecting rubber elastic body 22 is a rectangular block shaped rubber elastic body, it is interposed between the attachment member 18 and the first mass member 20 arranged facing opposite vertically, its bottom surface is adhered to the attachment member 18, and its top surface is adhered to the first mass member 20.

As the material of the rubber elastic body used as the connecting rubber elastic body 22, natural rubber, synthetic rubber, or a blended rubber of natural rubber and synthetic rubber is used. As synthetic rubber, examples include styrene-butadiene rubber, butadiene rubber, isoprene rubber, chloroprene rubber, isobutylene-isoprene rubber, chlorinated-isobutylene-isoprene rubber, acrylonitrile-butadiene rubber, hydrogenated-acrylonitrile-butadiene rubber, ethylene-propylene-diene rubber, ethylene-propylene rubber, acrylic rubber, silicone rubber and the like.

Also, the first mass member 20 of this embodiment is equipped with a cover member 28. The cover member 28 has a rectangular box shape that opens downward, and by a flange shaped fixing piece provided at the opening part being fixed by a bolt or the like to the first mass member 20, it is attached to the first mass member 20 so as to cover the top surface. By mounting of the cover member 28 as noted above, above the first mass member 20, a housing area 30 separated from the outside is defined by the cover member 28, and the support projection 24 of the first mass member 20 projects in the housing area 30.

Furthermore, it is desirable to have the mass: $m_1$ of the first mass member 20 including the cover member 28 be 10% or greater than the equivalent mass: M of the body 12 ($m_1 \geq 0.1*M$). By doing this, the first mass member 20 has sufficient effect on the vibration state of the body 12, and since it is possible to function as a dynamic damper, a vibration decrease of the body 12 can be expected by the vibration offset.

Also, a second vibration system 16 is arranged in the housing area 30. With the second vibration system 16, a second mass member 32 is attached to one end part of a plate spring 34 as a second spring member, and the other end part of the plate spring 34 is attached to the first mass member 20. As a result, the second vibration system 16 has a cantilever structure in which the second mass member 32 is elastically connected to the first mass member 20 by the plate spring 34.

The second mass member 32 has a rectangular block shape, and is formed from a high specific gravity material such as iron or the like, the same as the first mass member 20. Also, with this embodiment, the mass: $m_2$ of the second mass member 32 is set so as to satisfy $m_1*X>m_2*Q$ with the mass: $m_1$ of the first mass member 20. Note that X indicates the response magnification (resonance response magnification) at the natural frequency of the first vibration system 14, and Q indicates the resonance response magnification of the second vibration system 16, and with this embodiment, the resonance response magnification: Q of the second vibration system 16 is larger than the resonance response magnification: X of the first vibration system 14 (X<Q). Also, preferably, by having the mass: $m_2$ of the second mass member 32 be ⅕ or less as large as the mass: $m_1$ of the first mass member 20 ($m_2<m_1/5$), the second mass member 32 is smaller and lighter than the first mass member 20. In this way, by having the second mass member 32 be lighter than the first mass member 20, while the natural frequency of the vibration system is set according to the frequency of the vibration subject to power generation, the spring constant of the plate spring 34 is set to be sufficiently small, and it is possible to effectively generate relative displacement of the first mass member 20 in relation to the second mass member 32.

The plate spring 34 is a longitudinal plate shaped metal member formed from electrically conductive spring steel, and the second mass member 32 is fixed to one lengthwise direction end part, and the other lengthwise direction end part is overlapped and fixed by a screw to the support projection 24 of the first mass member 20. By doing this, the second mass member 32 is elastically connected to the first mass member 20 via the plate spring 34, and relative displacement of the second mass member 32 in relation to the first mass member 20 is allowed by elastic deformation in the shearing direction which is the plate thickness direction of the plate spring 34 (vertical direction in FIG. 1). As is clear from this, the power generator 10 is equipped with a two-degree-of-freedom vibration system constituted by the first vibration system 14 and the second vibration system 16.

With this embodiment, the mechanical natural frequency: $f_{r2}$ when the second vibration system 16 is handled as a one-degree-of-freedom vibration system is set to be a lower frequency than the mechanical natural frequency: $f_{r1}$ when the first vibration system 14 is handled as a one-degree-of-freedom vibration system ($f_{r2}<f_{r1}$). Furthermore, it is desirable for the natural frequency: $f_{r1}$ of the first vibration system 14 alone to be √2 times or less in relation to the natural frequency: $f_{r2}$ of the second vibration system 16 alone ($f_{r2}<f_{r1}\leq\sqrt{2}*f_{r2}$). By doing this, it is possible to avoid problems such as a decrease in power generating efficiency due to the offset displacement volume of the first mass member 20 in relation to the second mass member 32 being inhibited by the vibration damping action by the so-called sky hook damper effect. The mechanical natural frequency: $f_{r1}$ with the one-degree-of-freedom vibration system of the first vibration system 14 alone is calculated as with [Formula 1] from the mass: $m_1$ of the first mass member 20 and the spring constant: $k_1$ of the connecting rubber elastic body 22. The mechanical natural frequency: $f_{r2}$ with the one-degree-of-freedom vibration system of the second vibration system 16 alone is calculated as with [Formula 2] from the mass: $m_2$ of the second mass member 32 and the spring constant: $k_2$ of the plate spring 34.

$$f_{r1} = \frac{1}{2\pi}\sqrt{\frac{k_1}{m_1}} \qquad \text{[Formula 1]}$$

$$f_{r2} = \frac{1}{2\pi}\sqrt{\frac{k_2}{m_2}} \qquad \text{[Formula 2]}$$

Also, a power generating element 38 is adhered to the plate spring 34. For the power generating element 38, a typical piezoelectric element or electrostrictive element or the like is preferably used. By being overlapped on and adhered to the surface of the plate spring 34, the power generating element 38 is arranged between the first mass member 20 and the second mass member 32. Also, during vibration input, by having external force applied to the first mass member 20 from the body 12 transmitted to the second mass member 32, the first mass member 20 and the second mass member 32 are relatively displaced, and by the plate spring 34 being elastically deformed, the power generating element 38 generates electricity by deforming together with the plate spring 34. Said another way, vibration energy is input to the power generating element 38 by the relative displacement of the first mass member 20 and the second mass member 32, and the power generating element 38 converts vibration energy to electrical energy according to the volume of the relative displacement of the first mass member 20 and the second mass member 32. An electrical circuit 40 is connected to this power generating element 38, and this is electrically connected to power using a device (device 42) or the like such as a rectifier circuit, a power storage device, a sensor or the like. When using a piezoelectric element as the power generating element 38, as the forming material for that, for example a ceramic material, a monocrystalline material or the like can be used. More specifically, for example, any of lead zirconate titanate, aluminum nitride, lithium tantalate, lithium niobate or the like can be used suitably as the forming material for the piezoelectric element.

With this embodiment, the power generating element 38 adhered to the plate spring 34 is arranged in the housing area 30 separated from the external space by the cover member 28, and adhering of foreign matter such as water, dust or the like is prevented by being covered by the cover member 28.

With this embodiment, a stopper 44 that restricts the relative displacement of the second mass member 32 in relation to the first mass member 20 is provided, excessive deformation of the plate spring 34 and the power generating element 38 is prevented, and damage to the power generating element 38 is avoided. In specific terms, by having the second mass member 32 abut the top surface of the first mass member 20 and the upper bottom wall internal surface of the cover member 28, the stopper 44 is constituted including the first mass member 20 and the cover member 28. Also, with this embodiment, a stopper rubber 46 is adhered respectively on the top surface of the first mass member 20 and the upper bottom wall internal surface of the cover member 28, and the second mass member 32 is made to abut in a buffering manner the first mass member 20 and the cover member 28 via the stopper rubber 46.

With the power generator 10 of this embodiment constituted in this way, in the state mounted on the body 12, the vibration energy of the body 12 is converted to electrical energy and extracted by the power generating element 38. In light of that, with the power generator 10, by providing a two-degree-of-freedom vibration system and also arranging the power generating element 38 between the first and second mass members 20 and 32, efficient power generation is realized by the power generating element 38.

Figure 2:
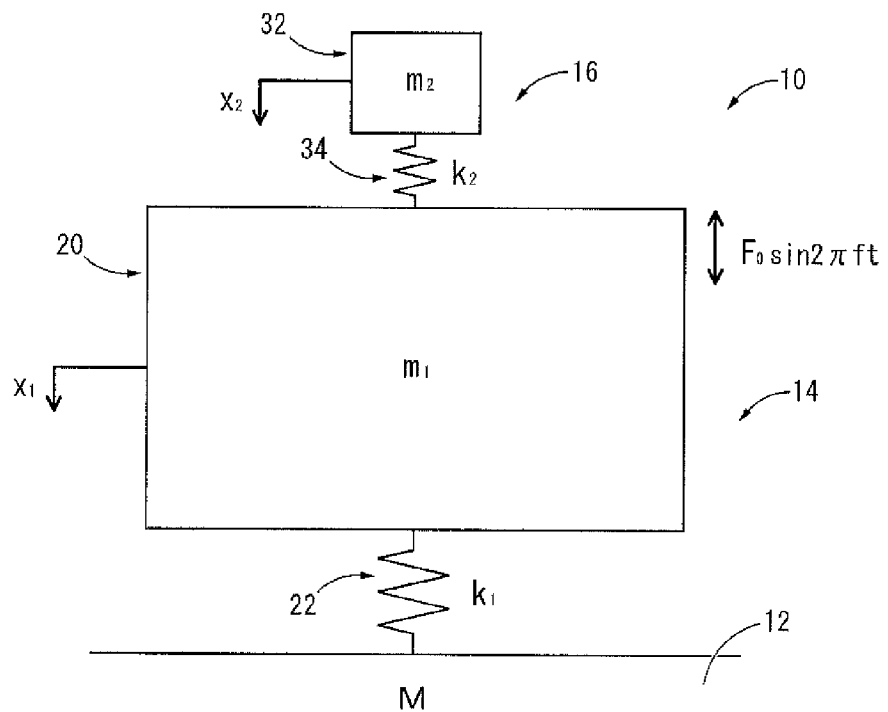
FIG. 2 is a vibration model suitable for describing the power generator shown in FIG. 1.

With this kind of power generator 10, mechanically, as described above, a two-degree-of-freedom vibration system is constituted for which the first vibration system 14 consisting of the first mass member 20 and the connecting rubber elastic body 22 as the first spring member, and the second vibration system 16 consisting of the second mass member 32 and the plate spring 34 as the second spring member are connected in series, so it is possible to analyze this using a known multiple-degree-of-freedom system type vibration model. Specifically, the vibration model of the mechanical vibration system of this power generator 10 is as shown in FIG. 2, and this is expressed by the known two-degree-of-freedom system motion equation shown in [Formula 3]. With [Formula 3], $x_1$ correlates to the displacement volume of the first mass member 20 with the power generator 10, and $x_2$ correlates to the displacement volume of the second mass member 32 with the power generator 10. Furthermore, $F_0 \sin 2\pi ft$ in [Formula 3] correlates to the vibration load input from the body 12 with the power generator 10.

$$\begin{cases} m_1 \ddot{x}_1 = -k_1 x_1 - k_2(x_1 - x_2) + F_0 \sin 2\pi ft \\ m_2 \ddot{x}_2 = -k_2(x_2 - x_1) \end{cases} \quad \text{[Formula 3]}$$

As is well known, the $\Omega_1$ and $\Omega_2$, ($\Omega_1 < \Omega_2$) found as the solution of the typical two-degree-of-freedom vibration system motion equation shown in [Formula 3] are the respective natural frequencies of the two-degree-of-freedom vibration system. However, the power generator 10 as the mechanical device is understood as a two-degree-of-freedom vibration system, but the vibration energy to the power generating element 38 is applied as offset deformation volume of the second mass member 32 in relation to the first mass member 20. Because of that, by the phase difference of the first mass member 20 and the second mass member 32 being approximately 180 degrees so they are displaced in the reverse direction, the vibration energy applied to the power generator 10 is efficiently applied to the power generating element 38 and it is possible to obtain a large amount of generated electric power.

To give a specific explanation, with the natural frequencies: $\Omega_1$ and $\Omega_2$ of the two-degree-of-freedom vibration system described above, though in theory either one can have the quantity of motion of the mass displacement be the peak, with the low frequency up to the first natural frequency: $\Omega_1$, the first and second mass members 20 and 32 move in the same phase, so it is difficult for the input vibration energy to be efficiently converted to generated electric power. In contrast to this, with the frequency from the first natural frequency: $\Omega_1$ to the second natural frequency: $\Omega_2$, the first and second mass members 20 and 32 move in the reverse phase, so it is possible to efficiently convert vibration energy to generated electric power and obtain a large generated electric power.

Here, to make it easy to understand, if we assume it is possible to understand the second vibration system 16 as a one-degree-of-freedom system for which the second mass member 32 is elastically displaced relative to the first mass member 20, then at the mechanical natural frequency: $f_{r2}$ as the one-degree-of-freedom vibration system of the second vibration system 16, the second mass member 32 of this second vibration system 16 has the phase of the first vibration system 14 in relation to the first mass member 20 reversed. In fact, in the frequency range of the natural frequency: $f_{r2}$, by the mechanical resonance phenomenon of the second vibration system 16, it is possible to efficiently obtain sufficient volume of relative displacement of the second mass member 32 in relation to the first mass member 20.

From this fact, with this embodiment for which the mechanical natural frequency of the second vibration system 16 is set to a lower frequency range than that of the first vibration system 14, even with a low frequency range up to the high frequency side natural frequency: $\Omega_2$ for which the first and second mass members 20 and 32 operate in reverse phase in the two-degree-of-freedom vibration system vibration mode, by the phase of the second mass member 32 being inverted in relation to the first mass member 20 in the frequency range exceeding the mechanical natural frequency: $f_{r2}$ as the one-degree-of-freedom vibration system of the second vibration system 16, it is possible to obtain a large amount of generated electric power with excellent power generating efficiency.

Figure 3:
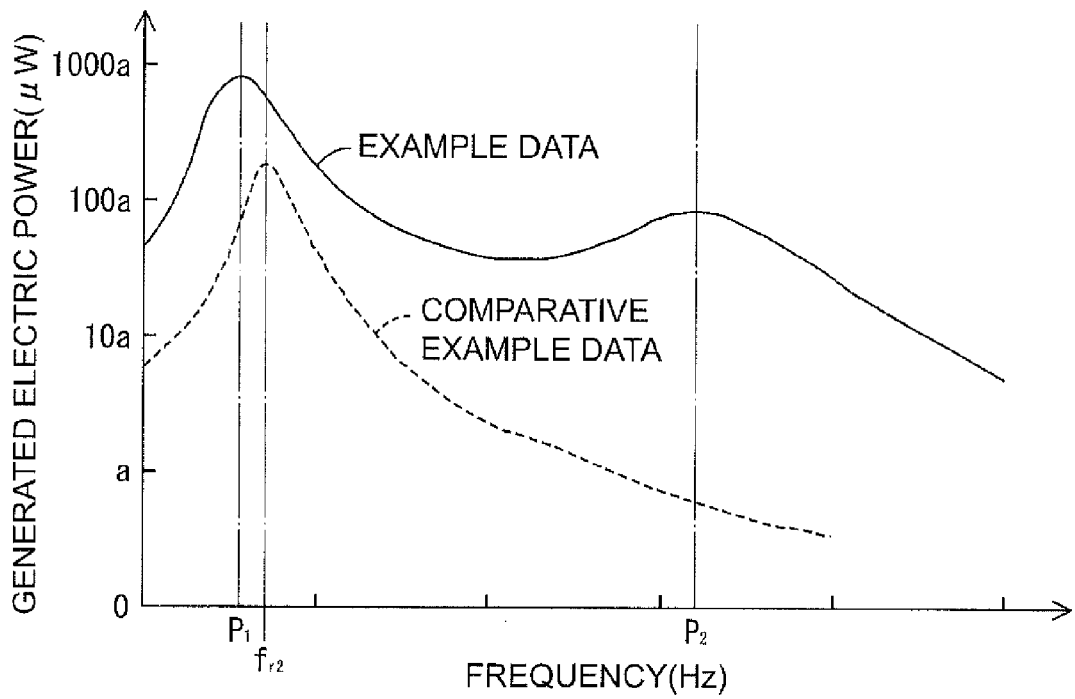
FIG. 3 is a graph showing the actual measurement values of the power generation volume of the power generator shown in FIG. 1 as the Example data, together with the Comparative Example data constituted by a one-degree-of-freedom vibration system.

This was also confirmed by the inventors with the actual measurement results of the generated electric power. Specifically, a prototype was produced of the power generator 10 constituted according to this embodiment shown in FIG. 1 and FIG. 2, and by doing sweep oscillation from the body 12 side, the frequency characteristics of the electric power generated by the power generating element 38 were measured. The results are shown in FIG. 3. In this FIG. 3, the actual measurement values of the generated electric power of the power generating element 38 are shown by a solid line as Example data, and the measurement values of the electric power generated by the power generator consisting of a mechanical one-degree-of-freedom system structure correlating to the second vibration system alone with the first vibration system omitted are shown by a dotted line as Comparative Example data.

As is also clear from FIG. 3, with the Comparative Example consisting substantially of the second vibration system alone, the generated electric power is nothing more than having one peak with only the frequency range of the mechanical natural frequency: $f_{r2}$ of the second vibration system, and when the input vibration is off from the natural frequency: $f_{r2}$, there is a marked decrease in power generating efficiency. In contrast to this, with the Example of the present invention, the generated electric power has respective peaks at two frequencies: $P_1$ and $P_2$, and high power generating efficiency is maintained in the frequency range between those two frequencies $P_1$ and $P_2$, or across a broad frequency range reaching a high frequency range exceeding $P_2$. Here, the frequency: $P_2$ that is the high frequency side peak is the frequency correlating to the high frequency side natural frequency: $\Omega_2$ for which the first and second mass members 20 and 32 move in reverse phase in the vibration mode of the two-degree-of-freedom vibration system. Meanwhile, the frequency: $P_1$ that is the low frequency side peak is the frequency correlating to the low frequency side natural frequency: $\Omega_1$ for which the first and second mass members 20 and 32 move in reverse phase in the vibration mode of the two-degree-of-freedom vibration system, and is the frequency roughly corresponding to the natural frequency: $f_{r2}$ for which the phase is inverted in relation to the first mass member with the second vibration system 16 as a one-degree-of-freedom vibration system.

Also, with this embodiment, the resonance response magnification: Q of the second vibration system 16 is greater than the resonance response magnification: X of the first vibration system 14 (X<Q), and the product of the mass: $m_1$ of the first mass member 20 and resonance response magnification: X of the first vibration system 14 is greater than the product of the mass: $m_2$ of the second mass member 32 and resonance response magnification: Q of the second vibration system 16 ($m_1*X > m_2*Q$). By doing this, during vibration input, the amplitude of the second mass member 32 and thus the elastic deformation volume of the plate spring 34 is ensured to be large, and power generation by the power generating element 38 is realized efficiently. Also, the oscillation force applied in a resonant state to the first mass member 20 is greater than the oscillation force applied in a resonant state to the second mass member 32, so the offset vibration damping action of the input vibration by the second vibration system 16 is inhibited, and by stably generating relative displacement of the first mass member 20 and the second mass member 32, more effective power generation is realized across a wide band.

Furthermore, with the power generator 10, the mass: $m_2$ of the second mass member 32 is ⅕ or less as large as the mass: $m_1$ of the first mass member 20, and while the mechanical natural frequency of the two-degree-of-freedom vibration system is set to a designated value, the spring constant: $k_2$ of the plate spring 34 is set to be small. Because of that, relative displacement of the second mass member 32 in relation to the first mass member 20 occurs easily, and it is possible to efficiently obtain power generation volume by the power generating element 38.

Also, with this embodiment, the mechanical natural frequency: $f_{r2}$ with the one-degree-of-freedom vibration system of the second vibration system 16 alone is set to be a lower frequency than the mechanism natural frequency: $f_{r1}$ with the one-degree-of-freedom vibration system of the first vibration system 14 ($f_{r2} < f_{r1}$). By doing this, it is possible to have sufficient relative displacement of the first mass member 20 in relation to the second mass member 32 occur during vibration input, and it is possible to increase the power generating efficiency corresponding to the volume of the relative displacement of the first mass member 20 and the second mass member 32.

Furthermore, by having $f_{r2} < f_{r1}$, with the frequency range from the mechanical natural frequency: $f_{r2}$ with the one-degree-of-freedom vibration system of the second vibration system 16 to the mechanical natural frequency: $f_{r1}$ with the one-degree-of-freedom vibration system of the first vibration system 14, the first mass member 20 is displaced in the same phase in relation to the input vibration. Because of that, via the first mass member 20 that has vibration displacement in the same phase in relation to the body 12, vibration energy is transmitted more efficiently to the second vibration system 16, and there is further improvement in the power generating efficiency. Meanwhile, when $f_{r2} \gg f_{r1}$, at the low frequency side natural frequency: $\Omega_1$ with the two-degree-of-freedom vibration system, the first vibration system 14 is displaced in the reverse phase in relation to the input vibration, so it is not possible to efficiently transmit vibration energy to the second vibration system 16. In light of that, by having $f_{r2} < f_{r1}$ as with this embodiment, it is possible to set the frequency range between $P_1$ to $P_2$ shown in FIG. 3 to be sufficiently large, and to obtain excellent power generating efficiency in an even broader frequency range.

Figure 4:
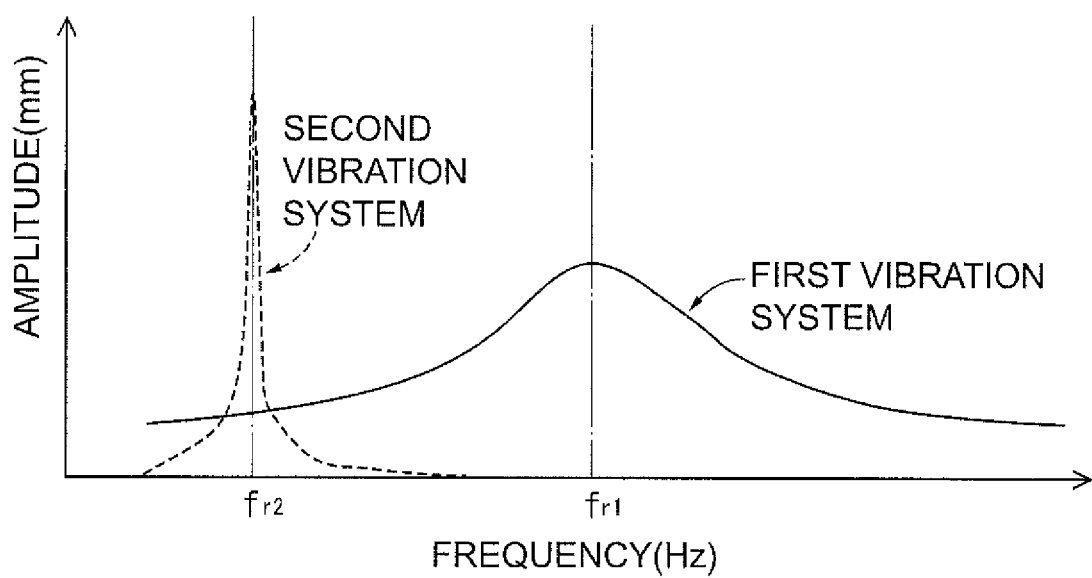
FIG. 4 is a graph showing the correlation between the frequency and amplitude when handling each vibration system constituting the power generator shown in FIG. 1 as a one-degree-of-freedom vibration system.

Also, the spring component of the first vibration system 14 constituting the two-degree-of-freedom vibration system of the power generator 10 is constituted by the connecting rubber elastic body 22 formed with a rubber elastic body, whereas the spring component of the second vibration system 16 is constituted by the plate spring 34 formed using metal. By doing this, as shown in FIG. 4, with the second vibration system 16, with a large resonance response magnification, while an amplitude for which power generation is possible is only obtained in a narrow frequency range near the resonance frequency, with the first vibration system 14, at a resonance response magnification smaller than that of the second vibration system 16, it is possible to obtain an amplitude at which power generation is possible across a broad frequency range. Because of that, by combining the first vibration system 14 and the second vibration system 16 to use together, the power generation which could be realized only in a very narrow frequency range with the second vibration system 16 alone can be realized efficiently for vibration input of a broader frequency range by the broadening of characteristics based on the damping performance of the connecting rubber elastic body 22 of the first vibration system 14. By doing this, effective power generation is possible under various vibration input conditions, and it is possible to provide a power generator 10 having high practical utility. In FIG. 4, the frequency-amplitude characteristics with the one-degree-of-freedom vibration system of the first vibration system 14 alone are shown by a solid line, and the frequency-amplitude characteristics with the one-degree-of-freedom vibration system of the second vibration system 16 alone are shown by a dotted line.

Also, with the power generator 10, by having the mechanical natural frequency: $f_{r1}$ with the one-degree-of-freedom vibration system of the first vibration system 14 alone be set to a higher frequency than the electrical antiresonance frequency: $f_{a2}$ of the multiple-degree-of-freedom vibration system constituted by the first and second vibration systems 14 and 16 ($f_{r1} > f_{a2}$), power generation is realized for vibration input of a broad frequency range. Hereafter, we will give a description using an equivalent circuit considering the electrical characteristics of the second vibration system 16 shown in FIG. 5.

Figure 5:
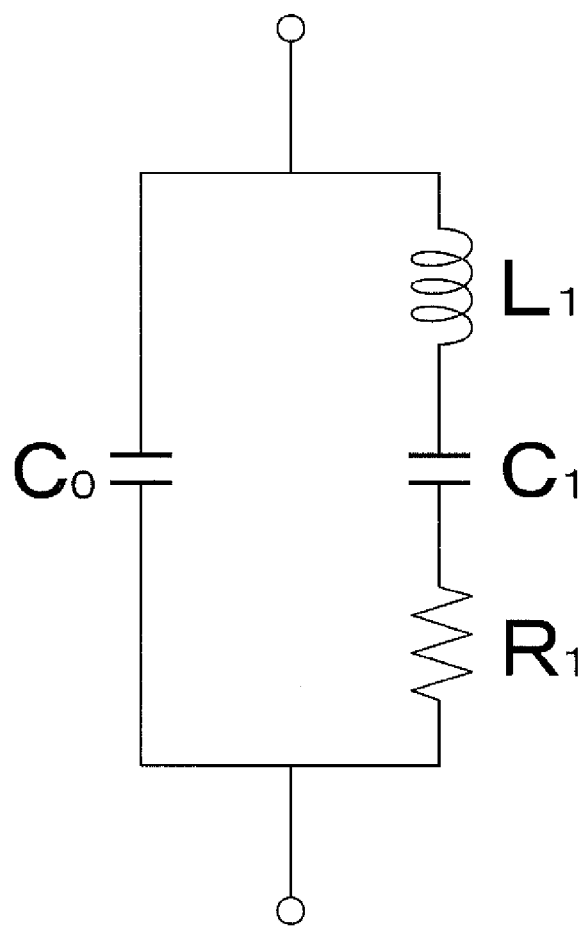
FIG. 5 is a schematic diagram showing an electrical equivalent circuit of a second vibration system of the power generator shown in FIG. 1.

The equivalent circuit of FIG. 5 is a circuit showing electromechanical conversion characteristics which are piezoelectric characteristics of the second vibration system 16 in which the power generating element 38 (piezoelectric element) is arranged, and is an item for which the mechanical vibration of the power generating element 38 is expressed as an electrical circuit by the serially arranged equivalent series inductance: $L_1$, equivalent series electrostatic capacity: $C_1$, equivalent series resistance: $R_1$, and parallel electrostatic capacity: $C_0$.

$L_1$, $C_1$, and $R_1$ are constants that are respectively uniquely determined according to the vibration mode. On the other hand, $C_0$ is the electrostatic capacity by the power generating element 38 functioning as a dielectric, and is a constant stipulated by the power generating element 38 size, dielectric constant, or the like.

Figure 6:
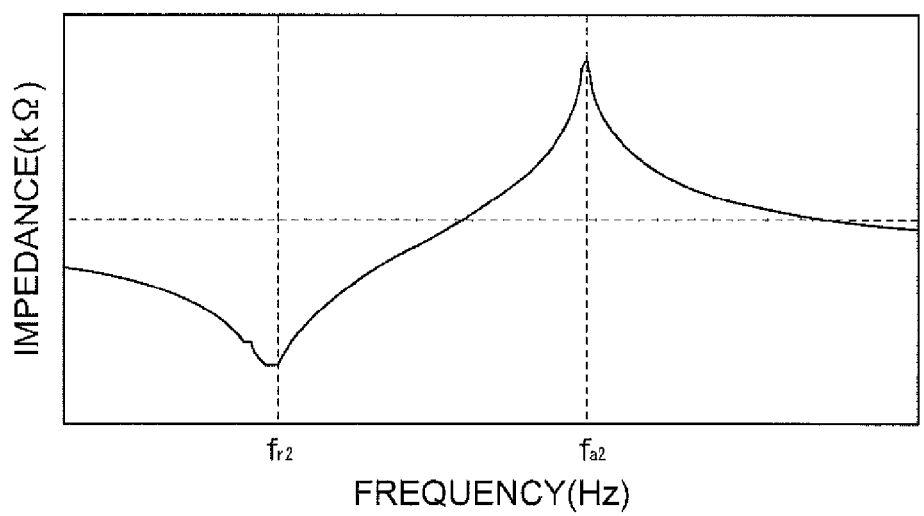
FIG. 6 is a graph showing the correlation between input vibration frequency, impedance, and phase for the equivalent circuit shown in FIG. 5.

The equivalent circuit considering the electrical characteristics of the second vibration system 16 is constituted from this kind of $L_1$, $C_1$, $R_1$, and $C_0$, so the impedance of the second vibration system 16 is as shown in the graph shown in FIG. 6 in relation to the frequency of the input vibration, and is an extremely small value with the serial resonance frequency: $f_{r2}$, and is an extremely large value with the electrical antiresonance frequency (parallel resonance frequency): $f_{a2}$. The serial resonance frequency is substantially the same as the mechanical resonance frequency: $f_{r2}$ of the second vibration system 16. Also, strictly speaking, the serial resonance frequency: $f_{r2}$ is slightly different from the frequency for which the impedance of the second vibration system 16 is an extremely small value by the effect of $C_0$, but here, they are regarded as being substantially the same. Similarly, the parallel resonance frequency: $f_{a2}$ is slightly different from the frequency for which the impedance of the second vibration system 16 is an extremely large value, but here it is regarded as being substantially the same.

As is also clear from the graph in FIG. 6, with the second vibration system 16 in which the power generating element 38 is arranged, while a large power generation volume can be obtained with the serial resonance frequency: $f_{r2}$, the power generation volume is small with the parallel resonance frequency: $f_{a2}$, and even with a higher frequency range than $f_{a2}$, the power generation volume continues at a relatively small state.

With the equivalent circuit of the second vibration system 16, the serial resonance frequency: $f_{r2}$ and the parallel resonance frequency (antiresonance frequency): $f_{a2}$ are defined by [Formula 4] and [Formula 5] hereafter.

$$f_{r2} = \frac{1}{2\pi\sqrt{L_1 C_1}} \quad \text{[Formula 4]}$$

$$f_{a2} = \frac{1}{2\pi\sqrt{L_1 C_0 C_1/(C_0 + C_1)}} \quad \text{[Formula 5]}$$

Meanwhile, with this embodiment, by having the vibration system of the power generator 10 have two degrees of freedom, by having the mechanical secondary natural frequency: $\Omega_1$ of the vibration system of the power generator 10 be set to a higher frequency than the mechanical anti-resonance frequency of the same vibration system, the decrease in the power generation is inhibited across a broad frequency range. From this, typically, by setting the mechanical natural frequency: $f_{r1}$ of the first vibration system 14 to a higher frequency than the parallel resonance frequency: $f_{a2}$ of the equivalent circuit, it is possible to prevent a decrease in power generating efficiency across a wide band.

Yet further, more preferably, by having the mechanical resonance frequency: $f_{r1}$ of the first vibration system 14 alone be $\sqrt{2}$ times or less in relation to the mechanical resonance frequency: $f_{r2}$ of the second vibration system 16 alone ($f_{r1} \leq \sqrt{2}*f_{r2}$), a large volume of the relative displacement of the first mass member 20 in relation to the second mass member 32 is ensured for vibration input of a broad frequency range. Because of that, more highly efficient power generation is realized by the power generating element 38 for vibration input of a broad frequency range. In other words, the mechanical resonance frequency: $f_{r1}$ of the first vibration system 14 alone is preferably set to a range of $f_{a2} < f_{r1} \leq \sqrt{2}*f_{r2}$.

When the inventors examined this with experiments and the like, by having $f_{r1} \leq \sqrt{2}*f_{r2}$, it is possible to have a combined vibration state by having the vibration with the first vibration system 14 and the vibration with the second vibration system 16 transmitted to each other. Specifically, for example in a case such as when the input vibration frequency changes, even in a state such as when one vibration stops when the first vibration system 14 and the second vibration system 16 vibrate completely independently from each other, by the other vibration system having an effect on that one vibration system, it is also possible to maintain a certain level of a vibrating state. By doing this, since the vibration of both is applied, it is possible to do complementary maintaining of the vibrating state of both vibration systems 14 and 16, so it is possible to even more efficiently achieve maintaining of the manifestation of the vibration state with the vibration systems 14 and 16 and thus realization of the target power generating state. With the first and second vibration systems 14 and 16, by setting each of the resonance frequencies to satisfy $f_{r1} \leq \sqrt{2}*f_{r2}$, realizing of complementary maintenance of the vibration state by combining vibrations can be understood as a help for Japanese Patent No. JP-B-4862286, for example.

Figure 7:
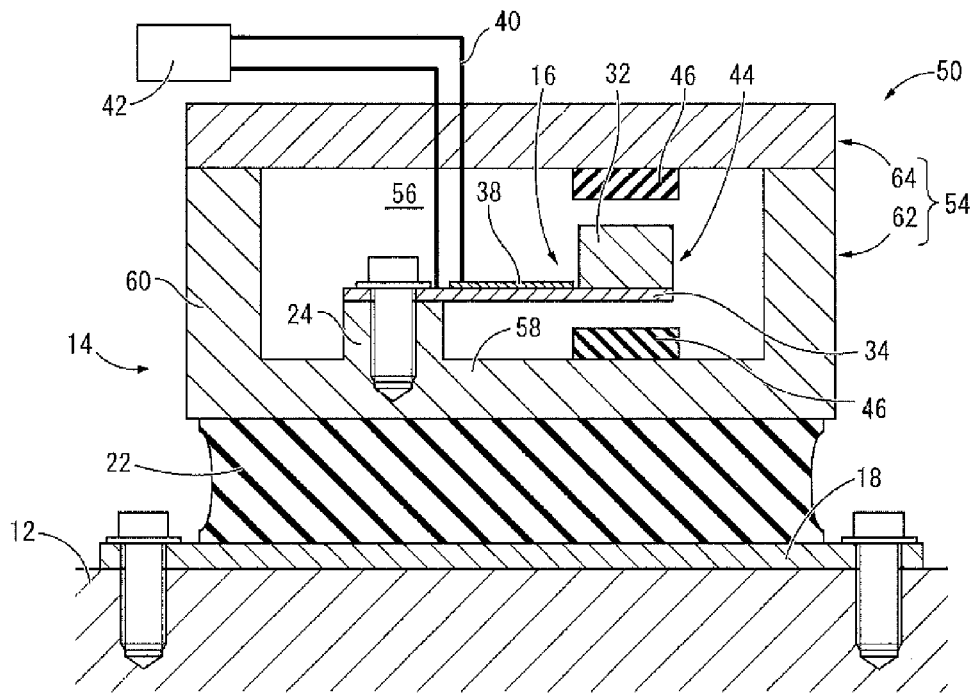
FIG. 7 is a vertical cross section view showing a power generator as another embodiment of the present invention.
Figure 8:
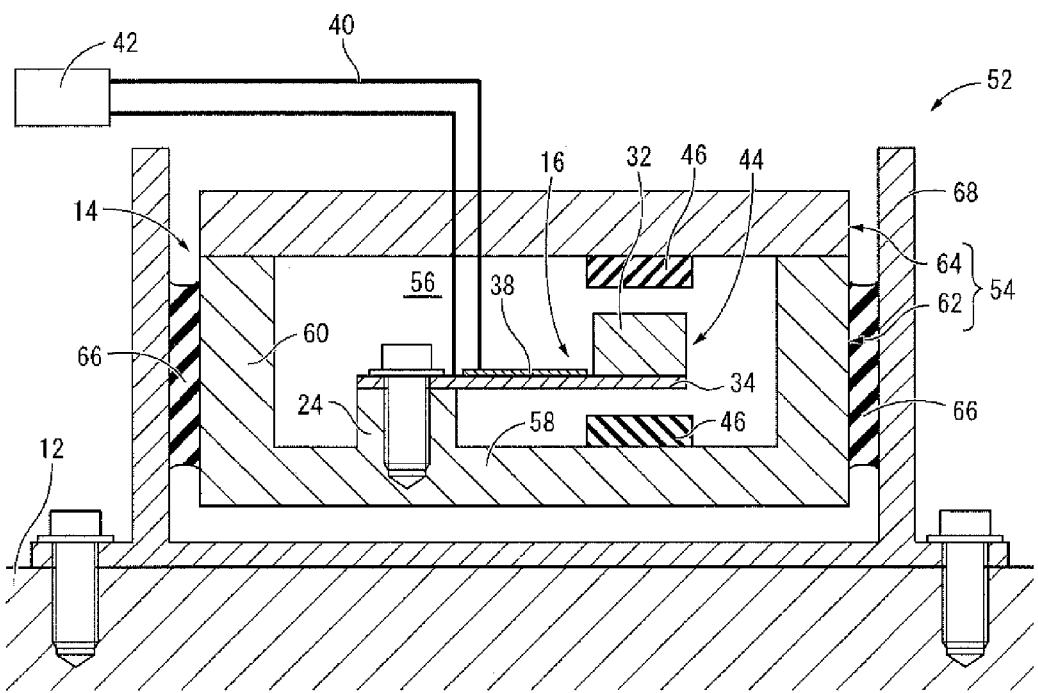
FIG. 8 is a vertical cross section view showing a power generator as yet another embodiment of the present invention.

Next, in FIG. 7 and FIG. 8, power generators 50 and 52 are respectively shown as other embodiments of the present invention. With these power generators 50 and 52, for the members and parts having the same constitution as those of the aforementioned embodiment, the same code numbers in the drawing as the respective items of the aforementioned embodiment are given, and a detailed description of those will be omitted.

Specifically, with the power generator 50 shown in FIG. 7, a first mass member 54 has a hollow structure, and with the first mass member 54, a housing space 56 is provided that is roughly cut off from the external space. The first mass member 54 of this kind of hollow structure is realized, for example, by overlapping a roughly plate shaped upper mass 64 on a lower mass 62 having roughly a tube shape with a bottom and equipped with a bottom wall 58 and a peripheral wall 60, and adhering it on the upper part opening of the lower mass 62 so as to cover it.

Also, in a state of being housed in the housing space 56 of the first mass member 54, the second vibration system 16 with roughly the same constitution as that of the aforementioned embodiment is provided. The housing space 56 is sufficiently large to allow displacement of the second mass member 32 along with elastic deformation of the plate spring 34 as the second spring member. Also, stopper rubbers 46 are respectively provided on the housing space 56 at both side wall parts of the displacement direction of the second mass member 32, and the displacement volume of the second mass member 32 is buffered and restricted.

With the power generator 50 constituted in this way, it is possible to set the center of gravity position of the first mass member 54 with the first vibration system 14 and the center of gravity position of the second mass member 32 with the second vibration system 16 to be close in the height direction. In fact, the first mass member 54 and the second mass member 32 can be aligned with the height made small from the support surface which is the adhering surface on the body 12 of the connecting rubber elastic body 22 as the first spring member, which becomes the vibration input reference surface.

Because of that, oscillation of the first mass member 54 and the second mass member 32 during vibration input is inhibited, and as a result of more stable vibration displacement in the vertical direction which is the target main vibration input direction, the elastic deformation volume of the connecting rubber elastic body 22 and the plate spring 34 becomes large, and there is further improvement of the conversion efficiency from vibration energy to electrical energy.

In fact, the arrangement area of the second vibration system 16 is cut off from the external space by the first mass member 54, so it is possible to give dust proof properties and water proof properties with a simple structure for the arrangement area of the second vibration system 16 without requiring a separate cover structure or the like.

In addition, by the first mass member 54 having a hollow structure, while ensuring a large mass weight with the large capacity outer circumference part, it is possible to house the second vibration system 16 in the housing space 56, and to avoid large projection upward from the first mass member 54 as with the aforementioned embodiment. As a result, while ensuring sufficient mass of the first mass member 54, it is possible to suppress the height direction size of the overall vibration damping device to be small.

Also, with the power generator 52 shown in FIG. 8, the same as with the power generator 50 shown in FIG. 7, the second vibration system 16 is provided in a state housed in the housing space 56 of the hollow structure first mass member 54. Meanwhile, the first mass member 54 is elastically connected to the body 12 as the vibrating member by a first spring member 66 provided on the outer circumference surface top of a peripheral wall 60.

Specifically, an attachment member 68 adhered by a bolt or the like to the body 12 is formed using a vertical wall structure separated to the outer circumference side of the first mass member 54, and the outer circumference surface of the first mass member 54 is aligned facing opposite in the direction roughly orthogonal to the main vibration input direction to the attachment member 68. Then, by the first spring member 66 consisting of a rubber elastic body being arranged between the outer circumference surface of the first mass member 54 and the surface facing opposite the attachment member 68, the first mass member 54 is elastically supported by the attachment member 68.

The first spring member 66 can be provided across the entire circumference of the first mass member 54, but it can also be provided positioned at a suitable number of locations on the circumference.

With the power generator 52 constituted in this way, since the first spring member 66 mainly has shear deformation in the main vibration input direction with the first vibration system 14 by vibration from the body 12, it is possible to do low dynamic spring tuning, and to have an improvement in the degree of freedom of the characteristics tuning. With the power generator 52 of this embodiment as well, it is also possible to do characteristics tuning by complementarily interposing a compression rubber between the bottom wall 58 of the first mass member 54 and the surface facing opposite the bottom wall of the attachment member 68.

Above, we gave a detailed description of embodiments of the present invention, but the present invention is not limited by that specific description. For example, as the vibration system of the power generator, it is also possible to use a multiple-degree-of-freedom vibration system of three degrees of freedom or greater by elastically connecting in series three or more mass members respectively via spring members. By doing this, it is possible to obtain high power generating efficiency for vibration input of an even broader frequency range. When using the multiple-degree-of-freedom vibration system of three degrees of freedom or greater, it is possible to select two mass members that are mutually elastically connected, and to provide a power generating element only between those mass members, but it is also possible to respectively provide power generating elements between a plurality of sets of mass members that are mutually elastically connected and arranged adjacent to each other.

Also, for example, it is also possible to constitute the multiple-degree-of-freedom vibration system of the power generator by respectively elastically connecting two or more second mass members to the first mass member via two or more second spring members that are in parallel and mutually independent. By doing this, since a plurality of second vibration systems are constituted, it is possible to have the mechanical natural frequencies of those second vibration systems alone be mutually different, and to realize effective power generation for vibration input of a broader frequency range, and by having the mechanical natural frequency of the second vibration system alone be mutually the same, to improve the power generation efficiency to vibration input of a specific frequency range.

Also, as the power generating element, in addition to being able to use any of a piezoelectric element, an electrostrictive element, a magnetostrictive element or the like for the power generating element, it is also possible to use a power generating structure using a solenoid operated system or the like using an electret or cross flux time changes. As can be understood from this, the specific structure of the second mass member and the second spring member constituting the second vibration system is not limited, and for example it is also possible to use as the second spring member a coil spring, rubber elastic body, rod spring or the like. Similarly, the specific structure of the first mass member and the first spring member is not particularly limited, and for example it is also possible to use as the first spring member a metal spring such as a coil spring, plate spring, rod spring or the like.

Also, with the power generator 10 of the aforementioned embodiments, by adjusting the mass ratio of the first mass member 20 in relation to the body 12, the first vibration system 14 applies a vibration damping action to the vibration of the body 12, but giving a function as a vibrating damping device to the power generator is not essential for the present invention. In other words, it is also possible to have the mass of the first mass member be less than 10% of the equivalent mass of the vibrating member, and it is also possible to arrange a vibration damping device such as a dynamic damper or the like separate from the power generator.

Also, as long as there is vibration input of an amount that is capable of power generation, the vibrating member is not particularly limited, but the power generator of the present invention can be particularly suitably used when the vibration levels of multiple types of vibration become maximum in mutually different vibration frequency ranges in the vibrating member. In specific terms, for example, with a washing machine for which the vibration frequency changes with the laundry weight or the like, with a refrigerator for which the vibration frequency changes according to the operation rate of the refrigerating machine or the like, an automobile for which the vibration frequency changes according to the traveling state, dents and bumps in the road surface or the like, the case, body or the like can become the vibrating member on which to mount the power generator.

With the aforementioned embodiments, the mechanical natural frequency: $f_{r2}$ when the second vibration system 16 is handled as a one-degree-of-freedom vibration system was set to be a lower frequency than the mechanical natural frequency: $f_{r1}$ when the first vibration system 14 is handled as a one-degree-of-freedom vibration system ($f_{r2} < f_{r1}$). In addition to that, the mass: $m_2$ of the second mass member 32 was set to satisfy $m_1*X > m_2*Q$ with the mass: $m_1$ of the first mass members 20 and 54 (X and Q are respectively the resonance response magnification of the first vibration system 14 and the second vibration system 16). However, the power generator of the present invention is not limited to these modes.

Specifically, even in a case when the mechanical natural frequency: $f_{r2}$ when the second vibration system 16 is handled as a one-degree-of-freedom vibration system is set to be a higher frequency than the mechanical natural frequency: $f_{r1}$ when the first vibration system 14 is handled as a one-degree-of-freedom vibration system ($f_{r2}>f_{r1}$), when the product of the mass: $m_1$ of the first mass members 20 and 54 and the resonance response magnification: X of the first vibration system 14 is close to the product of the mass: $m_2$ of the second mass member 32 and the resonance response magnification: Q of the second vibration system 16 ($m_1*X \approx m_2*Q$), an increase in power generation volume is obtained by the interaction of the first vibration system 14 and the second vibration system 16. Therefore, with the power generator of the present invention, it is acceptable for the mechanical natural frequency: $f_{r2}$ when the second vibration system 16 is handled as a one-degree-of-freedom vibration system to be different from the mechanical natural frequency: $f_{r1}$ when the first vibration system 14 is handled as a one-degree-of-freedom vibration system ($f_{r1} \neq f_{r2}$).

Furthermore, with the vibration power generators 50 and 52 shown in FIGS. 7 and 8, the lower mass 62 is roughly a tube shape with a bottom and the upper mass 64 is roughly a plane shape, the housing space 56 is formed by covering the top part opening part of the lower mass 62 from above with the upper mass 64, and the second vibration system 16 was housed inside this housing space 56, but the invention is not limited to this mode. Specifically, for example, it is also possible to have the lower mass be a roughly plane shape and for the upper mass to be a reverse direction roughly tube shape with a bottom, and for the first mass member to be constituted from a tube shaped member that opens to the side and a member that covers this side opening part.

What is claimed is:

1. A power generator comprising:
a vibration system configured to be attached to a vibrating member; and
a power generating element attached to the vibration system while converting vibration energy of the vibrating member to electrical energy, wherein
the vibration system is a multiple-degree-of-freedom vibration system that includes a first vibration system in which a first mass member is elastically supported by a first spring member, and a second vibration system in which a second mass member is elastically connected to the first mass member by a second spring member,
the power generating element is arranged between the first mass member and the second mass member, and relative displacement of the first mass member and the second mass member is caused with vibration being applied from the vibrating member to the first mass member and transmitted to the second mass member so that the vibration energy of the vibrating member is input to the power generating element,
a natural frequency of the first vibration system is different from a natural frequency of the second vibration system,
the first spring member is formed of rubber elastic bodies,
the rubber elastic bodies are arranged between surfaces of the first mass member and an attachment member configured to be attached to the vibrating member, which are opposite to each other in a direction orthogonal to a vibration input direction, the rubber elastic bodies respectively being arranged at a plurality of locations on a circumference of the first mass member,
the first mass member has a hollow structure provided with a housing space inside, and the second vibration system is housed within the housing space,
the second spring member of the second vibration system, is formed of a plate spring,
the power generating element is mounted on the plate spring, and
the second mass member is attached to one end side of the plate spring and another end side of the plate spring is attached to a support part arranged projecting in the housing space of the first mass member so that the plate spring is supported to be positioned more inwardly in the housing space than a peripheral wall part of the first mass member.

2. The power generator according to claim 1, wherein the natural frequency of the second vibration system is set to a lower frequency than the natural frequency of the first vibration system.

3. The power generator according to claim 1, wherein the natural frequency of the first vibration system is set to a higher frequency than an electrical antiresonance frequency of the second vibration system.

4. The power generator according to claim 1, wherein the natural frequency of the first vibration system is $\sqrt{2}$ times or less than the natural frequency of the second vibration system.

5. The power generator according to claim 1, wherein a resonance response magnification of the second vibration system is larger than a resonance response magnification of the first vibration system, and a product of a mass of the first mass member and the resonance response magnification of the first vibration system is larger than a product of a mass of the second mass member and the resonance response magnification of the second vibration system.

6. The power generator according to claim 1, further comprising a stopper that restricts the relative displacement of the second mass member in relation to the first mass member.

7. The power generator according to claim 1, wherein the power generator is configured to be mounted on a site of the vibrating member by which vibrations of multiple types whose vibration levels become a maximum within mutually different frequency ranges are applied to the vibration system.

* * * * *